(12) United States Patent
Melanson

(10) Patent No.: US 7,411,534 B1
(45) Date of Patent: Aug. 12, 2008

(54) ANALOG-TO-DIGITAL CONVERTER (ADC) HAVING INTEGRATOR DITHER INJECTION AND QUANTIZER OUTPUT COMPENSATION

(75) Inventor: John L. Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 11/766,049

(22) Filed: Jun. 20, 2007

(51) Int. Cl.
*H03M 1/20* (2006.01)

(52) U.S. Cl. .................................. 341/131; 341/143

(58) Field of Classification Search .......... 341/130–155
See application file for complete search history.

(56) References Cited

U.S. PATENT DOCUMENTS

| | | | |
|---|---|---|---|
| 5,073,778 A * | 12/1991 | Ueki et al. | 341/131 |
| 5,497,154 A * | 3/1996 | Komamura | 341/131 |
| 6,462,685 B1 * | 10/2002 | Korkala | 341/131 |
| 6,738,004 B2 | 5/2004 | Melanson | |
| 6,744,392 B2 * | 6/2004 | Melanson | 341/143 |
| 7,064,698 B2 * | 6/2006 | Locher et al. | 341/143 |
| 7,317,411 B1 * | 1/2008 | Nanda et al. | 341/131 |
| 7,365,667 B1 * | 4/2008 | Nanda et al. | 341/143 |

OTHER PUBLICATIONS

U.S. Appl. No. 11/297,016, filed Dec. 8, 2005, Melanson et al.
U.S. Appl. No. 11/297,011, filed Dec. 8, 2005, Melanson.
U.S. Appl. No. 11/534,195, filed Sep. 21, 2006, Nanda et al.
Robert, et al., "A Second-Order High-Resolution Incremental A/D Converter with Offset and Charge Injection Compensation", IEEE JSSC, vol. 23, No. 3, Jun. 1988.
Quinquempoix, et al., "A Low-Power 22-bit Incremental ADC with 4ppm INL, 2ppm Gain Error and 2uV DC Offset", Proceedings of ESSCIRC, Grenoble, FR 2005.

* cited by examiner

*Primary Examiner*—Lam T Mai
(74) *Attorney, Agent, or Firm*—Andrew M. Harris; Mitch Harris, Atty at Law, LLC

(57) ABSTRACT

An analog-to-digital converter (ADC) having integrator dither injection and quantizer output compensation reduces the probability of unchanging code sequences that occur when the input signal and feedback signal are equal and thus no quantizer output change occurs. In particular, in modulators that are periodically reset, the dither reduces the probability of a stuck code sequence at startup. The effect of the dither is removed from the output of the ADC, either by subtracting an offset value from the result of filtering the quantizer output, or directly from the quantizer output itself.

22 Claims, 7 Drawing Sheets

ANALOG-TO-DIGITAL CONVERTER (ADC) HAVING INTEGRATOR DITHER INJECTION AND QUANTIZER OUTPUT COMPENSATION

CROSS-REFERENCE TO RELATED APPLICATIONS

The present application is related to co-pending U.S. patent application Ser. No. 11/543,191, entitled "DELTA-SIGMA ANALOG-TO-DIGITAL CONVERTER (ADC) HAVING AN INTERMITTENT POWER-DOWN STATE BETWEEN CONVERSION CYCLES", filed on Sep. 21, 2006, having at least one common inventor, and assigned to the same assignee. The above-referenced U.S. patent application is incorporated herein by reference.

BACKGROUND OF THE INVENTION

1. Field of the Invention

The present invention relates generally to analog-to-digital converters, and more specifically, to a delta-sigma modulator-based analog-to-digital converter in which a dither value is introduced to the noise-shaping filter and then compensated by removal from the quantized converter result.

2. Background of the Invention

Delta-sigma modulators are in widespread use in analog-to-digital converters (ADCs) and digital-to-analog converters (DACs), in which they provide very linear behavior and simple implementation due to the reduced number of bits used in the analog signal comparison. Delta-sigma modulators can be implemented with a high level of control of the frequency distribution of "quantization noise", which is the difference between the ideal output value of the modulator as determined by the input signal and the actual output of the modulator provided by a quantizer. The relative simplicity of the architecture and the ability to finely control the quantization noise makes delta-sigma converter implementations very desirable.

The delta-sigma modulator based ADC typically includes an analog noise-shaping filter that receives an input signal and a quantizer that converts the analog output of the noise-shaping filter to a digital representation. A feedback signal provided from the output of the quantizer is provided to the analog noise-shaping filter to close the loop such that the average output of the quantizer is equal to the value of the input signal. The output of the quantizer is then filtered by a low-pass digital filter having a large number of taps, in order to provide an accurate conversion result from the quantizer output, which typically includes hundreds of values per conversion cycle.

Dither is often introduced to the analog noise-shaping filter or directly into the quantizer of a delta-sigma modulator-based ADC, in order to ensure that the signal level being quantized has sufficient changes so that the quantizer output is constantly changing and therefore providing the above-described noise-shaping operation. However, in precision ADCs, the addition of dither generates an error in the output that is undesirable. Therefore, application of dither is a trade-off between providing sufficient dither to ensure that the converter produces no "stuck" codes, while minimizing the level of error due to the dither.

Therefore, it would be desirable to provide a delta-sigma modulator that has a reduced frequency of stuck code sequences, while producing little or no error due to the introduction of dither. It would further be desirable to provide such a delta-sigma modulator that can be reset for intermittent operation.

SUMMARY OF THE INVENTION

The above stated objective of providing a delta-sigma modulator having a reduced number of stuck code sequences with little or no error due to dither, is realized in an analog-to-digital converter (ADC) circuit and its method of operation.

The ADC includes a delta-sigma modulator with a noise-shaping filter that provides an output to a quantizer input. Dither is injected into the noise-shaping filter, which is generally a single value for each conversion cycle of the ADC. The output of the quantizer is coupled to a combiner that subtracts an offset due to the dither value for the conversion cycle from the result of filtering the quantizer output. Alternatively, an offset value may be subtracted directly from the output of the quantizer.

The dither value may be generated by a psuedo-random number generator, or may be a repeating pattern of dither values. The dither may be injected into any number of the noise-shaping filter integrator stages, and may be generated as a pattern of multi-valued inputs selected at each integrator input.

The foregoing and other objectives, features, and advantages of the invention will be apparent from the following, more particular, description of the preferred embodiment of the invention, as illustrated in the accompanying drawings.

DESCRIPTION OF ILLUSTRATIVE EMBODIMENT

The present invention encompasses a method and apparatus for preventing stuck code sequences produced from a delta-sigma modulator quantizer output when the feedback signal and input signal are close in value. In particular, the techniques of the present invention are applied to a delta-sigma modulator of a delta-sigma modulator based analog-to-digital converter (ADC) that supports substantially differing selectable sample rates by resetting the converter and shutting the modulator down between conversions. The present invention reduces the probability of long sequences of unchanging quantizer output codes that may otherwise be produced when the modulator is restarted, and may be applied in general to delta-sigma modulators operated continuously, as well.

A dither signal generation circuit works together with a dither compensation circuit to inject a dither signal into the noise-shaping filter to prevent a sequence of unchanging quantizer output codes from occurring when the input signal and feedback signal are close in value. The dither value changes each conversion cycle. The dither compensation circuit removes a change in the ADC output value due to the injected dither value for the cycle by subtracting a single correction value from the output of the digital filter at the output of the ADC. Alternatively, a fraction of the correction value can be subtracted from the quantizer at each modulator sample. However, such an implementation is generally not preferred, as the resolution of the compensation subtraction, and therefore the resolution of the digital filter input must generally be increased to accommodate the compensation scheme.

Figure 1:
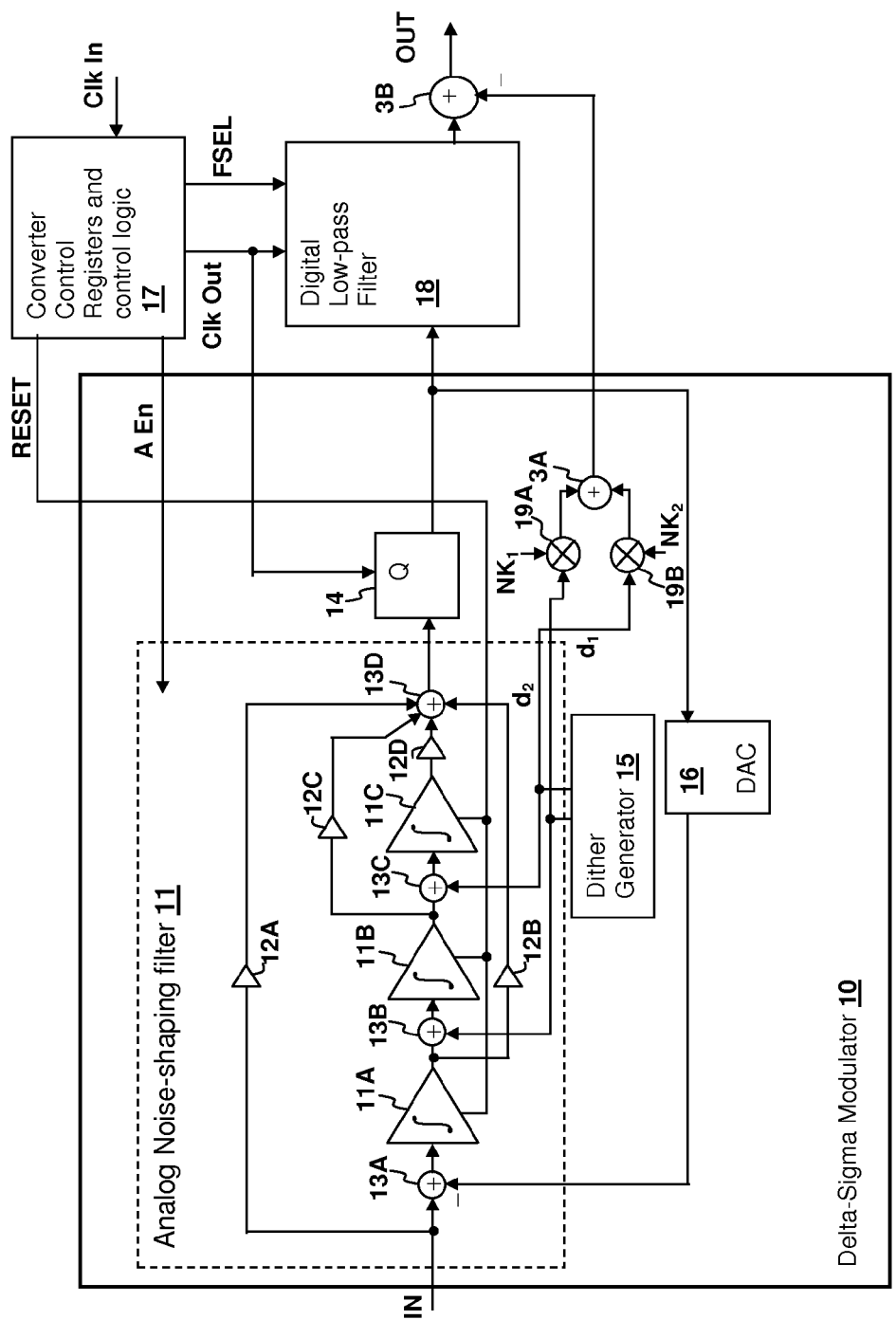
FIG. 1 is a block diagram depicting an ADC in accordance with an embodiment of the present invention.

Referring now to FIG. 1, an ADC converter circuit in accordance with an embodiment of the present invention is shown. An analog signal IN is provided to a delta-sigma modulator 10. Delta-sigma modulator 10 provides a digital output containing quantization noise and having a time-average value representing input signal IN. A digital low pass filter 18 provides a digital output signal OUT of the ADC by filtering the output of delta-sigma modulator 10. Converter control registers and logic 17 supplies clock signals to a digital low pass filter 18 and a quantizer 14 of delta-sigma modulator 10, and in discrete-time implementations of an analog noise-shaping filter 11 of delta-sigma modulator 10, provides the clocks to other portions of delta-sigma modulator 10.

Analog noise-shaping filter 11 is a feed-forward third-order noise-shaping filter design, which may be a continuous-time analog filter or may be a switched-capacitor filter. There are advantages to implementing analog noise-shaping filter 11 as a discrete-time circuit as will be pointed out in further detail below. However, it is understood that with appropriate additional isolation switching elements, analog noise-shaping filter 11 of the ADC circuit of the present invention may be implemented as a continuous-time analog filter. A series of cascaded integrators 11A-11C receive at a first integrator stage 11A, a signal representing the difference between the input signal and a feedback signal provided by a digital-to-analog converter (DAC) 16 that converts the output of quantizer 14 to an analog signal, which are combined by combiner 13A. The output of quantizer 14 is also supplied to digital low-pass filter 18, which attenuates the quantization noise introduced by delta-sigma modulator 10.

A set of feed-forward signal paths are provided through scalers 12A-12D and are summed by a combiner 13D that provides an analog input to quantizer 14. When a clock signal is applied to quantizer 14, the feedback signal provided by DAC 16 closes the loop around delta-sigma modulator 10, enforcing the condition that the time-average output of quantizer represents the selected input signal. A dither generator 15 provides a dither signal to one or more integrator stages 11A-11C of analog noise-shaping filter 11, which are injected into one or more of combiners 13B or 13C, as illustrated. It is understood that the dither signal could be additionally or alternatively introduced into combiner 13A or combiner 13D. However, introduction into combiner 13A is not preferred, as the injected dither would be introduced with a gain as large as that provided to input signal IN, which would increase noise/distortion over that of the depicted embodiment. Furthermore, injection into combiner 13D is also not preferred, as the dynamic range of integrator stage 11C would need to be increased over that required in the depicted embodiment.

Dither generator 15 generates a pseudo-random sequence of values, one for each conversion cycle, so that sequences of unchanging codes are prevented at the output of quantizer 14 when the feedback value and the analog input signal IN are close in value. Because analog noise-shaping filter integrator stages 11A-11C are reset between conversion cycles, without the action of dither generator 15, unchanging quantizer code sequences can be frequent under the condition of substantially equal feedback and input signal values, causing changes in the noise-shaping characteristics of the ADC and consequent reduction in performance.

While the output of dither generator 15 is shown as introduced to each of integrator stage 11A-11C for generality, it is understood that the dither value may be introduced to a single integrator stage, or both of integrator stages 11B-11C. Furthermore, the dither value applied at integrator stages 11B-11C may differ, and the relative amounts applied at each of integrator stages 11B-11C can be varied from conversion cycle to conversion cycle. Finally, as will be illustrated in further detail below, the dither value(s) may be preset into the integrator stages at the beginning of the conversion cycle or injected as a single or multiple sample width offset pulse during any point in the conversion cycle. Alternatively, the dither value(s) may be injected as a constant input to one or both of integrator stages 11B-11C, causing a ramp in the output of the integrator which yields a constant offset in the quantizer input at the end of each sample.

Since the injected dither value will generate an error in the digital output OUT, a dither compensation circuit is employed to remove the error, which is an offset determined by the magnitude and sign of the dither value(s) introduced to analog noise-shaping filter 11 and the impulse response of analog noise-shaping filter 11 with respect to each point in analog noise-shaping filter 11 at which the dither is injected. The resultant error due to the dither injection, no matter where or at how many stages the dither value is injected, will be the product of the injected dither and a dither compensation scaling value K, which may be expressed as a dither compensation scaling value for each injection point, e.g., dither compensation scaling value $K_1$ corresponding to dither injected into the input of integrator stage 11B and dither compensation scaling value $K_2$ corresponding to dither injected into the input of integrator stage 11C, as shown in FIG. 1.

The offset resulting from the injection of dither may be generally expressed as:

$$Offset \Box \sum_{n \Box 1}^{N} d_m[n] a_m[n] h[n]$$

where m is the index of the integrator stage, N is the number of modulator samples in an ADC conversion cycle, $d_m[n]$ is the dither injected for the $n^{th}$ sample at the $m^{th}$ stage, $a_m$ is the coefficient of the transfer function of analog noise-shaping filter 11 from the dither input at the $m^{th}$ stage to the output of analog noise-shaping filter 11, and h[n] is the transfer function of the digital low-pass filter 18. If the dither values $d_m$ are injected as constant values throughout the conversion cycle, the above equation can be reduced to:

$$Offset \Box N d_m \sum_{n \Box 1}^{N} a_m[n] h[n]$$

When dither values $d_m$ are preset in the integrator stages prior to the conversion cycle, the reduced expression is:

$$\text{Offset} = d_m \sum_{n=1}^{N} a_m[n]h[n]$$

and when dither values $d_m$ are injected at a single subsequent sample p during the conversion cycle, the reduced expression is:

$$\text{Offset} = d_m \sum_{n=p}^{N} a_m[n]h[n]$$

For each of the above cases, the summation $$K_m = \sum_{n}^{N} a_m[n]h[n]$$

for each m is a pre-determinable constant, which corresponds directly to dither compensation values $K_1$ and $K_2$ and depends only on the transfer functions of analog loop filter 11 and digital low-pass filter 18.

In the embodiment depicted in FIG. 1, dither compensation scaling values are provided as constants $NK_1$ and $NK_2$, since in the embodiment of FIG. 1, the dither values $d_1$ and $d_2$ are applied to the inputs of corresponding integrator stages 11B and 11C as constant values throughout the conversion cycle. Dither values $d_1$ and $d_2$ are also provided to multipliers 19A and 19B, which scale dither values $d_1$ and $d_2$ by dither compensation scaling values $NK_1$ and $NK_2$, and the resultant scaled dither components are added by combiner 3A to yield the offset value, which is subtracted from the output of digital low-pass filter 18, by a combiner 3B, which generally would be included in the mathematical blocks comprising digital low-pass filter 18. While the illustrative embodiment shows a dither compensation scheme that treats each point of dither introduction (i.e., dither values $d_1$ and $d_2$) separately, it is understood that the relative amounts of dither applied to each dither injection point can be fixed or known for each conversion cycle and a compensation value determined from the relative amounts and a single dither value. Further, as an alternative to multipliers 19A and 19B and combiners 3A and 3B, a look-up table (ROM) or combinatorial logic can be used to generate a dither compensation value in conformity with the dither amount for addition/subtraction from the output of digital low-pass filter 18. Since the dither value will generally have a low bit resolution (e.g., 4 bits or less) and the relative amount of dither injection is also varied with a low resolution selection, such a look-up ROM yields a design-efficient solution.

In the operation of the ADC of FIG. 1, when the sample rate of the converter is at a maximum, the converter operates at least substantially continuously as described above, providing a digital output at the end of each conversion cycle that represents the analog input signal selected by multiplexing sample/hold circuit 8. Delta-sigma modulator 10 also may or may not be reset after each conversion. However, for sample rates substantially lower than the maximum sample rate, the converter of FIG. 1 can be operated intermittently and portions of the converter powered-down and reset prior-to performing another conversion, so that the power consumption of the converter can be reduced for lower sample rates, just as in non-delta-sigma converters.

Converter control registers and logic 17 controls the clock signals and power supply distribution to delta-sigma modulator, as well as to digital low-pass filter 18, so that either automatically when a lower sample rate is selected, or by register manipulation of bits within converter control registers and logic 17 in conjunction with a sample rate change. Several operating changes are made for the lower sample rate. Clock signal Clk Out is changed from a continuous clock for the higher sample rate, to a burst clock at the lower sample rate, where the burst contains the same number of clocks at the lower sample rate that are required for a conversion cycle at the higher sample rate. Therefore, the duty factor of the burst is the ratio of the lower sample rate to the higher sample rate. For example, a converter supporting selectable operation at both 50 kHz and 5 kHz and having an over-sampling ratio of 256, would have a continuous Clk Out signal of 12.8 MHz when the 50 kHz sampling rate is selected and a 20 μS long burst of 256 clocks of frequency 12.8 MHz at intervals of 200 μS when the 5 kHz sampling rate is selected.

Between the clock bursts, which operate modulator at 12.8 Mhz even for the lower sampling rate, converter control registers and logic 17 disable the analog power supplies to analog noise-shaping filter 11 by disabling an analog circuit enable signal A En provided to analog noise-shaping filter 11. Analog circuit enable signal A En is re-enabled several modulator clock cycles, for example 10 clock cycles, so that integrators 11A-11C, summers 13A, 13B, scalers 12A-12D and DAC 16 have stable outputs prior to re-applying clocks to quantizer 14, i.e., before the start of the next clock burst. The clock signal supplied to digital low-pass filter may also be halted after filtering of the conversion data provided during the clock burst is complete. A RESET signal is also supplied to analog noise-shaping filter 11, which causes integrators 11A-11C to be held in a reset state until the conversion is started. As pointed out above, the RESET signal may also be applied between conversions during continuous operation.

Additionally, converter control registers and logic 17 may either automatically when a lower sample rate is selected, or by register manipulation of bits within converter control registers and logic 17 in conjunction with a sample rate change, change the operation of digital low-pass filter 18. The operation of digital low-pass filter is changed from that of a traditional symmetrical time-domain window function, to that of a half-filter response that starts at the peak value of the impulse response with the first sample and then decays to a substantially zero value. Because the burst operation and RESET signal described above enforce a known state in the modulator at the beginning of each conversion cycle for the lower sample rate, a half-filter response can be used for the digital low-pass filter 18 that provides substantially the same result that would be had from a traditional filter response that receives twice the number of modulator samples. Since the number of modulator samples per conversion cycle is constant when the lower sample rate is selected, e.g. 256 samples per conversion cycle in the example given above, using the half filter gives substantially the same performance as if the number of samples has been doubled, with the modulator still interrupted every 100 μS. If delta-sigma modulator 10 is reset in continuous mode operation, the same advantages can be had from the application of the half-filter. However, if the half-filter response is selected, the values of dither compensation coefficients $K_m$ must be computed in accordance with the half-filter transfer function according to the equations above.

During the intermittent lower-sample rate conversion of the depicted embodiment, at the beginning of modulator operation, the output of summer 13A starts at zero due to the resetting of the modulator prior to the clock signal burst, and therefore long sequences of repeated code values are more frequent for low input signal values. Therefore, dither generator 15 or some other mechanism is needed to ensure that the quantizer does not produce long sequences of the same quantizer output code value during startup of the modulator. Dither generator 15 prevents long sequences of the same quantizer output code value by ensuring that the output of final integrator stage 11C changes soon after the start of a conversion cycle, even if the input to the first integrator stage 11A is near zero.

Figure 2:
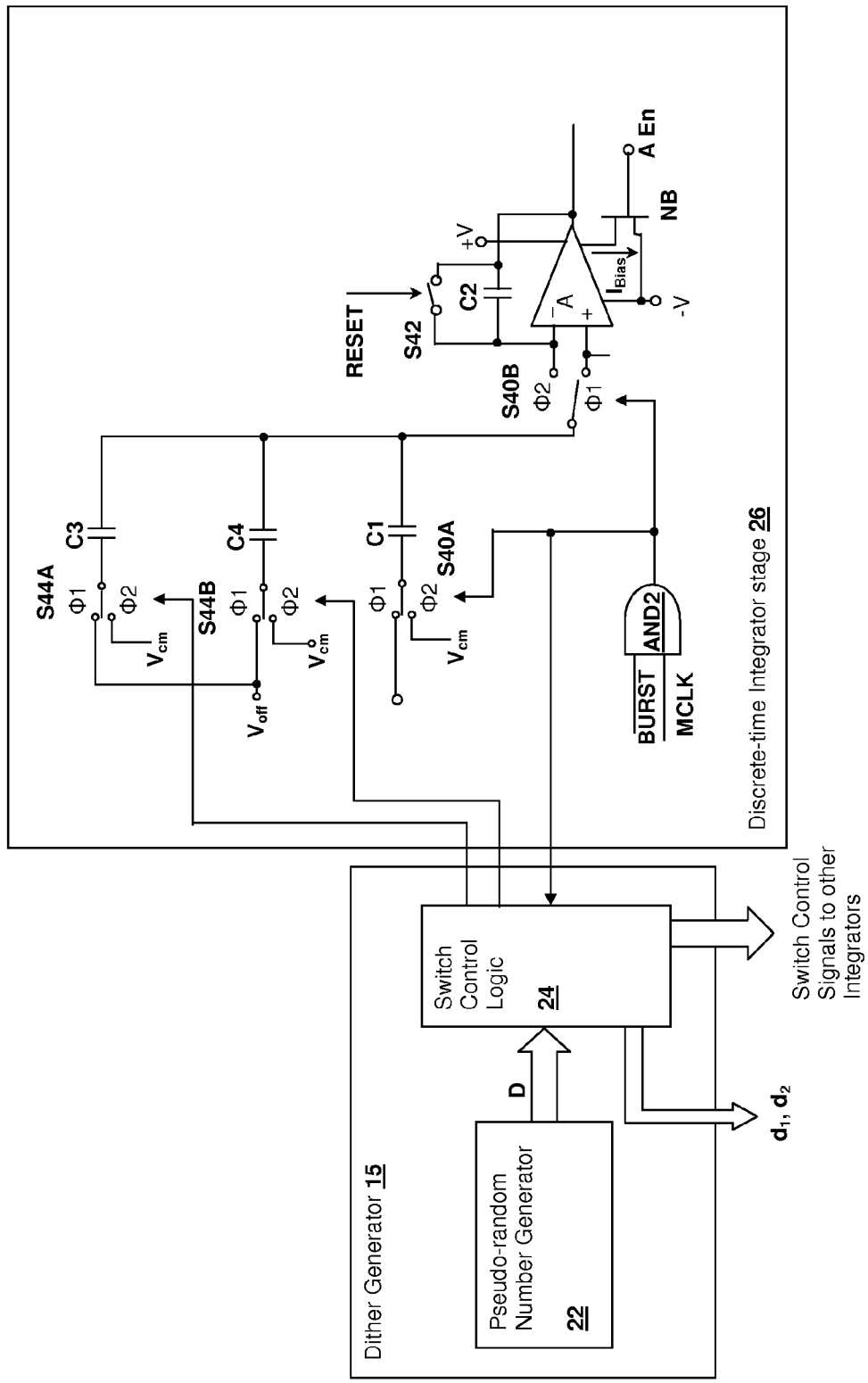
FIG. 2 is a block diagram depicting details of the ADC of FIG. 1.

Referring now to FIG. 2, details of dither generator 15 are illustrated, along with a single discrete-time integrator stage 26 used to illustrate the application of the techniques of the present invention to one or more integrator stages 11A-11C of FIG. 1. Although a single-ended switched-capacitor integrator is shown for simplicity, a fully differential switched-capacitor integrator stage is generally used in the converter. Switches S40A and S40B apply capacitor C1 alternatively to the input node of the stage and to the summing node of amplifier A, thus producing operation as a resistance. Feedback capacitor C2 in combination with the input resistance yields an integrator. Logical AND gate AND2 is shown as controlling the burst of pulses applied to switches S40A and S40B in the intermittent conversion mode, which will be a continuous MClk signal in the continuous conversion mode. Analog circuit enable signal A En is supplied to the gate of transistor NB, which controls the bias current levels $I_{Bias}$ in amplifier A. Amplifier A acts as an integrator as described above, and is reset by switch S42 in response to the RESET signal.

Switches S44A and S44B apply an offset voltage $V_{off}$, which is scaled by the value of capacitors C3 and C4 to produce one of four selectable dither values for each conversion cycle. Dither generator 15 includes a pseudo-random number generator 22, which supplies dither value D as a digital control value to switch control logic 24, which controls switches S44A and S44B in accordance with the burst clock signal provided by the output of logical AND gate AND2 as qualified by a decode of dither value D, which determines which of switches S44A and S44B (or neither or both) will be activated for all of the modulator samples in a given conversion cycle. Dither value D is then supplied from pseudo-random number generator 22 and the values of $d_1$ and $d_2$ for the conversion cycle is supplied from switch control logic 24 so that multipliers 19A and 19B can generate the correct offset values for the conversion cycle from the relative proportion of dither value D applied at each integrator stage.

Since dither generator 15 is a digital circuit block along with multipliers 19A and 19B and combiners 3A and 3B, it is understood that many different circuit arrangements can be used to provide the final dither compensation value for removal from the output of digital low-pass filter, as long as that value reflects the output of pseudo-random number generator 22, the necessary dither compensation scaling value $K_1$ and $K_2$ and any variation in the relative distribution of dither value D among integrator stages 11B-11C. Further, it is not necessary that dither value D be generated randomly, in particular since its effects are removed from the output of the ADC. However, due to circuit variations, if dither value D is generated from a sequence that is not random, tones that generate errors in the output of the ADC could result.

Figure 3:
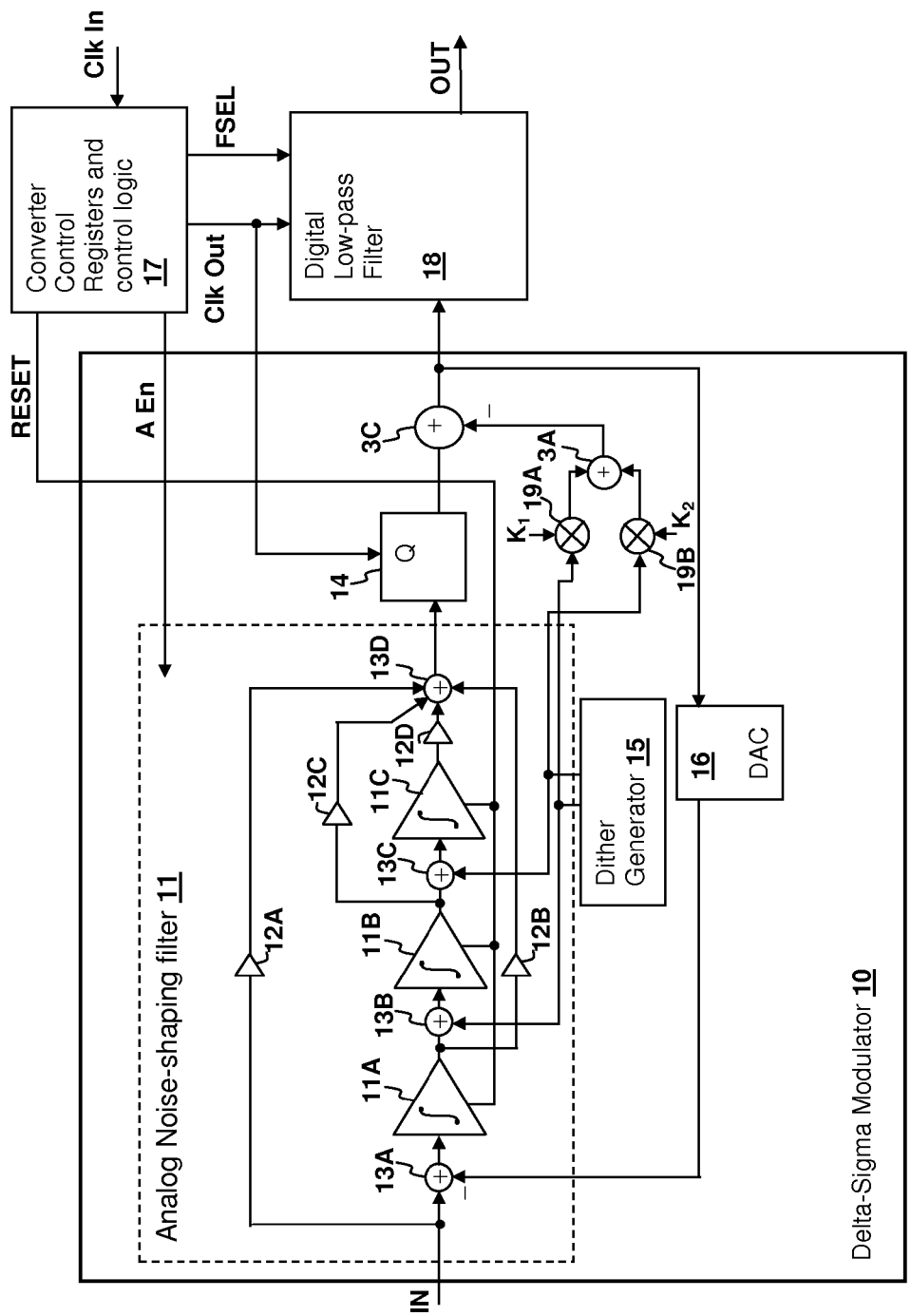
FIG. 3 is a block diagram depicting an ADC in accordance with another embodiment of the present invention.

Referring now to FIG. 3, an ADC circuit in accordance with another embodiment of the present invention is shown. The depicted embodiment is similar to the embodiment of FIG. 1, so only differences between the circuits and their operation will be described below. In the ADC circuit of FIG. 3, rather than subtracting the output of combiner 3A from the output of digital low-pass filter 18, a dither compensation value is subtracted from the output of quantizer 14 by a combiner 3C for each sample of delta-sigma modulator 10. Assuming that combiner 3C effectively removes all of the offset due to the dither at each sample of delta-sigma modulator 10, the resultant offset can be expressed as:

$$Offset = d_m \sum_{n=1}^{N} a_m[n]$$

which does not require foreknowledge of the transfer function of digital low-pass filter 18. Therefore, the expression for dither compensation scaling values $K_m$ is:

$$K_m = \sum_{n=1}^{N} a_m[n]$$

However, the ADC circuit of FIG. 3 has a disadvantage in that digital low-pass filter 18 needs to have a higher input resolution in the circuit of FIG. 1. Even if the output of quantizer 14 is, for example, four bits, the value of K will require a higher resolution to properly express the dither compensation value and thereby remove the exact amount of injected offset at each sample of delta-sigma modulator 10. If the offset is not removed precisely, the transfer function of digital low-pass filter 18 would also be implicated in the result, as the errors would likely differ at each modulator sample and have a different weighting in the final output of digital low-pass filter 18, according to the transfer function of digital low-pass filter 18.

Figure 4:
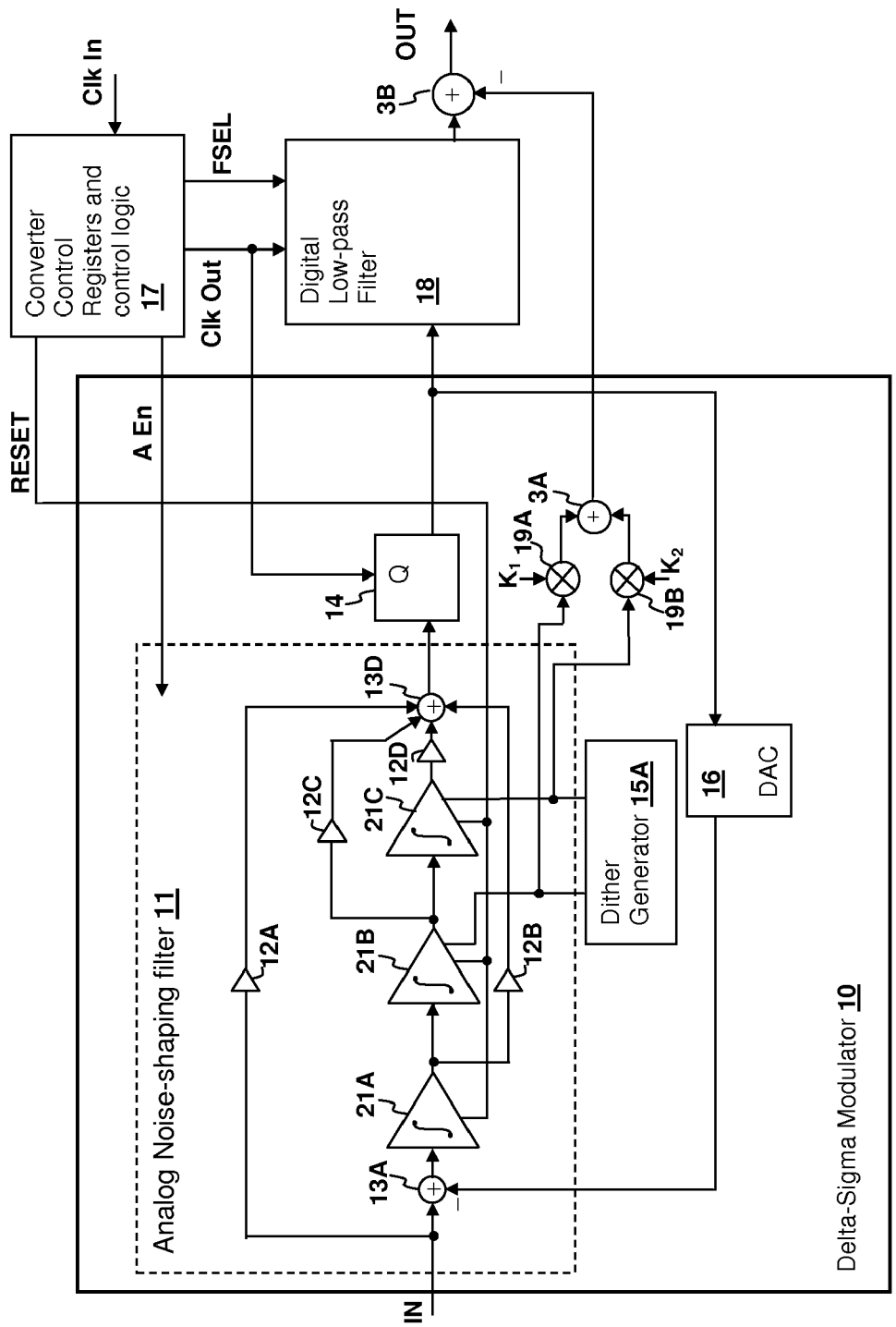
FIG. 4 is a block diagram depicting an ADC in accordance with yet another embodiment of the present invention.

Referring now to FIG. 4, an ADC circuit in accordance with yet another embodiment of the present invention is shown. The depicted embodiment is similar to the embodiment of FIG. 1, so only differences between the circuits and their operation will be described below. The depicted embodiment provides a simpler architecture with a reduced amount of charge-injection noise for a discrete-time implementation over the ADC embodiment depicted in FIG. 1. Rather than resetting integrator stages 21A-21C to $V_{cm}$ and adding dither values via combiners 13A-C, as in the embodiment of FIG. 1, in the present embodiment, integrator stages 21A-21C are preset to one or more dither-determined values at the beginning of each ADC conversion cycle.

A dither generator 15A is therefore shown as coupled to each of integrator stages 21A-21C, along with control signal RESET. When control signal RESET is de-asserted, a dither amount is applied to at least one of integrator stages 21A-21C, although illustrated as applied to all of integrator stages 21A-21C for the sake of generality, similar to the discussion above with respect to FIG. 1. Furthermore, while the illustration shows a dither compensation circuit identical to that illustrated in FIG. 1, it is understood that the alternative dither compensation scheme of FIG. 3 may be applied to the circuit of FIG. 4.

Figure 5:
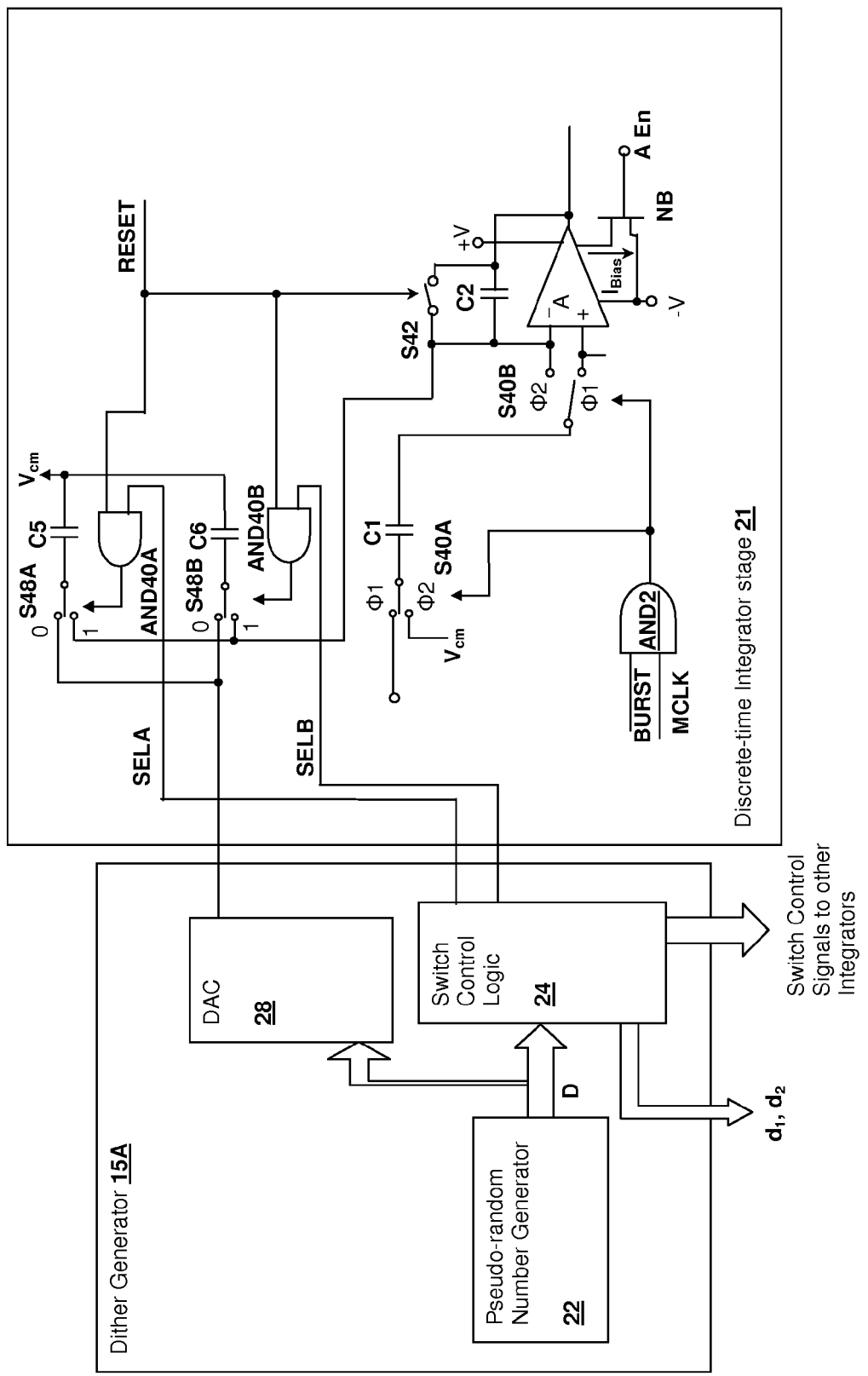
FIG. 5 is a block diagram depicting details of the ADC of FIG. 4.

Referring now to FIG. 5, details of dither generator 15A of FIG. 4 are illustrated, along with a single discrete-time integrator stage 21, used to illustrate the application of the techniques of the present invention to one or more integrator stages 21A-21C of FIG. 4. The circuit of FIG. 5 is similar to the circuit of FIG. 2, therefore only differences between them will be described in detail below. Although a single-ended switched-capacitor integrator stage 21 is shown for simplicity, a fully differential switched-capacitor integrator stage is generally used in the converter. Switches S40A and S40B, switch S42, capacitor C1, feedback capacitor C2, logical AND gate AND2 and transistor NB operate as described above with reference to FIG. 2. However, in the embodiment of FIG. 5, the dither value for each cycle is applied from a DAC 28, which converts the digital dither value to an analog voltage used to preset one or more of integrator stages 21A-21C of FIG. 4.

As shown, a pair of switches S48A and S48B are responsive to the RESET control signal to apply the output of DAC 28 to one or more of capacitors C5 and C6, as selected by selection signals SELA and SELB. Logical-AND gates AND40A and AND40B qualify selection signals SELA and SELB with the RESET signal to set the state of switches S48A and S48B charge one, both or none of capacitors C5 and C6 to a voltage corresponding to the output of DAC 28 while RESET control signal is asserted. Then, when the RESET control signal is de-asserted, switches S48A and S48B couple capacitors C5 and C6 to the summing node of amplifier A, thereby pre-setting integrator stage 21 to a voltage determined by the output of DAC 28 and the output of switch control logic 24. For single level application of the output of DAC 28 to each dithered integrator stage, switch control logic 24 may be omitted, along with logical-AND gates AND40A, AND40B, along with switch S48B and capacitor C6. Switch 48A is then directly controlled by the RESET control signal.

As illustrated, switches S48A and S48B apply an offset voltage which is scaled by the value of capacitors C5 and C6 to produce one of four scalings of the output of DAC 28 (one of the scalings being zero), which is changed at each conversion cycle. In contrast to the operation of the circuit of FIG. 2, charge injection noise is reduced in the circuit of FIG. 5, as only switch 40A is clocked at the rate of clock signal MCLK while the BURST control signal is active, whereas in the circuit of FIG. 2, the dither value is clocked in by switches S44A and S44B for each cycle of clock signal MCLK for which the BURST control signal is active.

Figure 6:
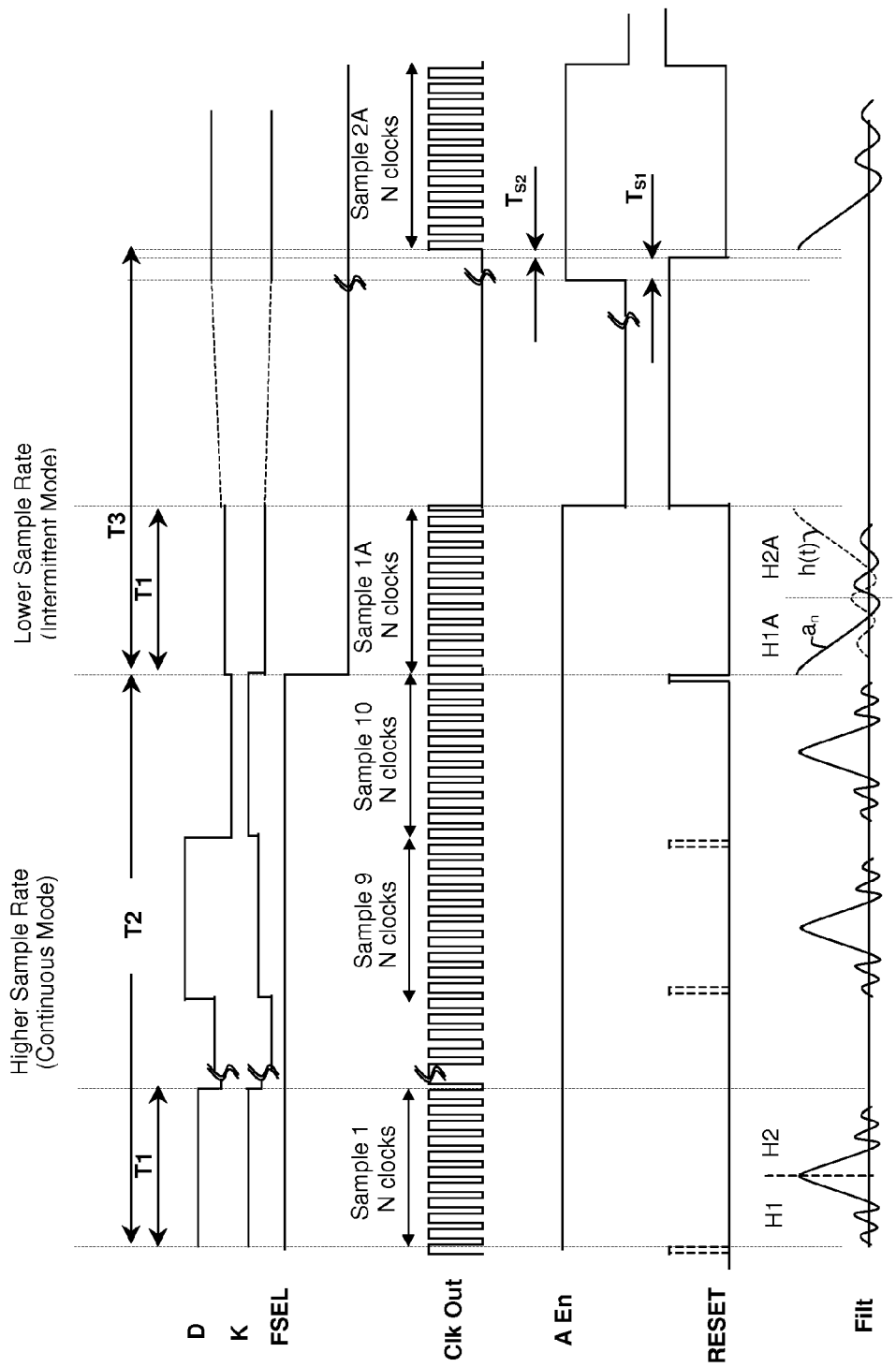
FIG. 6 is a signal timing diagram depicting signal relationships within the circuits of FIG. 1, FIG. 3 and FIG. 4.

Referring now to FIG. 6, an exemplary set of signals within the circuits of FIG. 1, FIG. 3 and FIG. 4 are shown in time and voltage relationship with each other, to further demonstrate the operation of the depicted embodiment. The clock output signal Clk Out is used to represent a single clock that operates the various digital portions of the ADC circuit of FIG. 1, FIG. 3 and FIG. 4. However, it is understood that the actual clocks used to operate the various blocks may constitute several clocks and the clocks may be of differing frequency. For example, the output digital low-pass filter 18 might be operated at a lower clock frequency than quantizer 14, with a decimation-by-two block provided between the output of quantizer 14 and digital low-pass filter 18. Further, the clock bursts that intermittently operate quantizer 14 and digital low-pass filter 18 will generally be offset by at least one-half clock period so that valid output values of quantizer 14 are latched and subsequently operated on by digital low-pass filter 18. Dither value D is shown changing at every conversion cycle, as well as dither compensation scaling values $K_m$, although it is understood that for circuits in which the dither is applied to a single integrator stage or in which the relative dither fraction per stage is constant, that dither compensation scaling values $K_m$ will be constant.

The left-most portion of the signal diagram of FIG. 6, displays operation in a continuous mode corresponding to the maximum sample rate of the converter. While the dither value D and dither compensation scaling values $K_m$ are shown as changing in both modes for illustrative purposes, it is understood that dither may be optionally omitted for the continuous mode of operation. Clock signal Clk Out is provided continuously, and the time periods indicated as T1 and T2 correspond to one conversion cycle and ten conversion cycles, respectively, in the left-most portion of the diagram. The right-most portion of the diagram depicts operation in the intermittent mode of the lower sample rate, where the time period T1 is again the time to perform one conversion cycle, and the time period T3 is the time between conversion cycles, which, for the given example of a 10:1 ratio between higher and lower sample rates, is equal to T2.

Signal A En is the signal that enables the analog circuits in analog noise-shaping filter 11 and is shown as continuously enabled during continuous operation, and enabled at a time $T_{S1}+T_{S2}$ prior to the start of the clock burst of clock signal Clk Out. Signal RESET is de-asserted at time $T_{S2}$ prior to the start of the burst of clock signal Clk Out to enable switch S1 and as depicted may also be present during continuous mode operation and is also asserted prior to the first conversion cycle in intermittent mode. Finally, waveform Filt is representative of the coefficients of the time-domain window function of digital low-pass filter 18, which is shown in normal filter mode in continuous mode operation on the left side of the diagram, and in half-filter mode during intermittent operation. The impulse response h(t) shown in dashed lines is provided by multiplying the sequence of output values from quantizer 14 corresponding to each modulator clock of the clock signal Clk Out burst with the coefficients of the window function shown as $a_n$.

The half-filter mode differs from the normal mode of digital low-pass filter 18, as illustrated by the asymmetric response shown with first half H1A having the peak coefficient placed at or near the first modulator sample (indicated by the first clock pulse of the clock burst of signal Clk Out) and generally decreasing amplitude to the end of the clock burst, with a lower energy during half-interval H2A compared to half-interval H1A. The normal response shown in the left half of the signal diagram has response halves H1 and H2 that are mirror images of each other. However, as noted above, if delta-sigma modulator 10 is reset between conversions in continuous mode, the half-filter response may also be used for those conversions.

Figure 7:
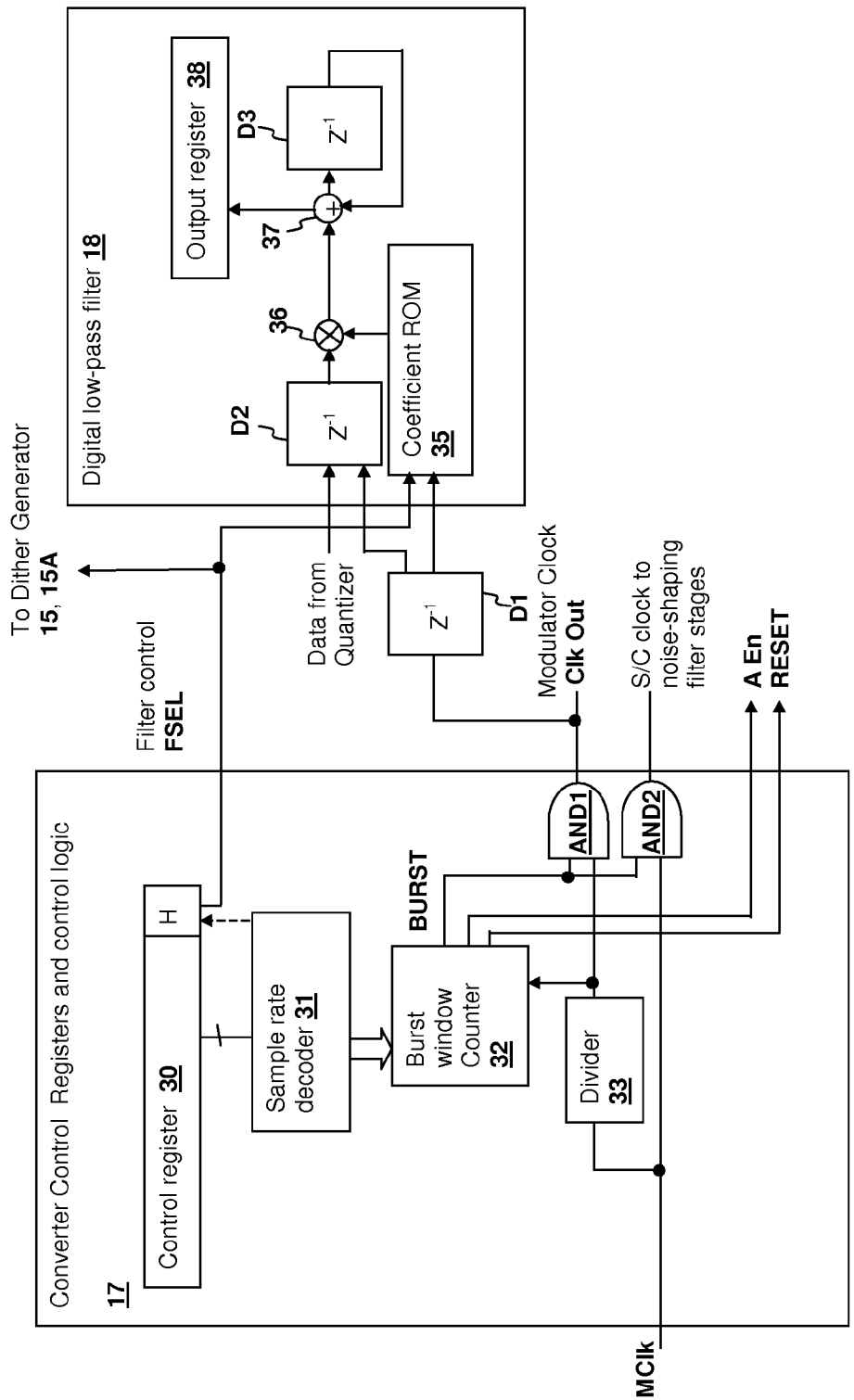
FIG. 7 is a block diagram depicting the structure of converter control registers and control logic 17 and digital low-pass filter 18 of FIG. 1, FIG. 3 and FIG. 4.

Referring now to FIG. 7, details of converter control registers and control logic 17 and digital low-pass filter 18 of FIG. 1 and FIG. 3 are shown. Within converter control registers and control logic 17, a control register 30 receives at least a sample rate selection value and an optional bit H for controlling the mode of digital low-pass filter 18. Bit H may be set automatically in response to a decode of the sample rate provided by sample rate decoder 31 to a burst window counter 32, so that the half-filter mode described above is automatically engaged when the lower (intermittent mode) sample rate is selected. Bit H is also supplied to dither generator 15 of FIG. 2 or dither generator 15A of FIG. 5, so that dither compensation values $K_m$ can be adjusted in accordance with the selected transfer function of digital low-pass filter 18, if the alternative dither compensation scheme of FIG. 3 is not employed. Burst window counter 32 receives a clock input from a divider 33 that scales the master clock signal MClk to the operating frequency of the modulator. A logical AND gate AND1 provides a burst of clock pulses at the rate of the output of divider 33 to the modulator as the Clk Out signal and logical AND gate AND2 provides a burst of clock pulses at the rate of master clock signal MClk to operate switched-capacitor integrators in analog noise-shaping filter 11 of FIG. 1, FIG. 3 and FIG. 4. If continuous-mode integrators are employed, divider 33 is not used, and master clock signal MClk can be provided at the modulator clock rate.

Burst window counter 32 also provides the A En signal and RESET signals from decodes of the internal count, so that the A En signal is activated several counts prior to the BURST signal being asserted, and the RESET signal is de-asserted after the A En signal is activated and just prior to the BURST signal being asserted. When the higher sample rate (continuous mode) is selected and detected by sample rate decoder 31, burst window counter 32 asserts the BURST signal continuously to enable logical AND gates AND1 and AND2, and also continuously asserts the A En signal and de-asserts the RESET signal, to provide continuous operation of the modulator 10 of FIG. 1, FIG. 3 and FIG. 4.

A unit clock delay D1 delays the modulator clock to clock the values at the output of delta-sigma modulator 10 into latch D2, and also to clock coefficients from coefficient ROM 35. The output of coefficient ROM 35 and the output of latch D2 are multiplied by a multiplier 36 and summed by an adder 37 with accumulated previous addition results of adder 37 that are stored in latch D3. The H bit is provided to coefficient ROM 35 to select between coefficients of the half-filter or full filter response as described above. An output register 38 provides for latching the resultant accumulation of the products of the coefficients and the output values from delta-sigma modulator 10, resulting in the convolution that yields the low-pass filter output.

While the invention has been particularly shown and described with reference to the preferred embodiments thereof, it will be understood by those skilled in the art that the foregoing and other changes in form and details may be made therein without departing from the spirit and scope of the invention.

What is claimed:

1. An analog-to-digital converter, comprising:
   a noise-shaping filter;
   a dither generator for generating dither values, wherein an output of the dither generator is coupled to a stage of the noise-shaping filter;
   a quantizer having an input coupled to an output of the noise-shaping filter; and
   a dither compensation circuit having a first input coupled to an output of the quantizer, a second input coupled to an output of the dither generator and an output for providing an output of the analog-to-digital-converter, wherein the dither compensation circuit adjusts values determined in conformity with the output of the quantizer to remove an offset caused by introduction of the dither values to the noise-shaping filter.

2. The analog-to-digital converter circuit of claim 1, wherein the dither generator generates a single dither value for each conversion cycle of the analog-to-digital converter, and wherein the dither compensation circuit applies the same adjustment to each value of the quantizer within the sample period.

3. The analog-to-digital converter circuit of claim 2, further comprising a digital filter for providing a filter result representing a plurality of samples of the quantizer, wherein the dither compensation circuit applies a single adjustment to the output of the digital filter for the conversion cycle.

4. The analog-to-digital-converter circuit of claim 1, wherein the dither generator comprises a pseudo-random number generator for generating a pseudo-random pattern of dither values.

5. The analog-to-digital-converter of claim 1, further comprising a digital filter for providing a filter result representing a plurality of samples of the quantizer, and wherein the filter has an input coupled to an output of the quantizer, wherein the first input of the dither compensation circuit is coupled to an output of the digital filter, wherein the dither generator generates a single dither value for the plurality of samples, whereby the dither compensation circuit adjusts the filter result to provide the output of the analog-to-digital-converter.

6. The analog-to-digital-converter of claim 5, wherein the dither compensation circuit comprises:
   a multiplier for multiplying the output of the dither generator by a compensation scaling value; and
   a combiner for adding or subtracting an output of the multiplier from the filter result.

7. The analog-to-digital-converter of claim 6, wherein the compensation scaling value is determined for each conversion cycle in conformity with a relative amount of dither applied to multiple stages of the noise-shaping filter.

8. The analog-to-digital-converter circuit of claim 1, wherein the dither compensation circuit comprises:
   a multiplier for multiplying the output of the dither generator by a compensation scaling value; and
   a combiner for adding or subtracting an output of the multiplier from each output of the quantizer.

9. The analog-to-digital converter circuit of claim 1, wherein the output of the dither generator is coupled to inputs of multiple stages of the noise-shaping filter.

10. The analog-to-digital converter circuit of claim 9, wherein the dither generator comprises:
    a switching circuit coupled to the inputs of the multiple stages of the noise-shaping filter for providing selectable offsets to the noise-shaping filter; and
    a pattern generator for controlling a selected state of the switching circuit, whereby a varying dither is generated by varying a pattern of the selectable offsets.

11. The analog-to-digital converter circuit of claim 10, wherein the switching circuit comprises:
    a plurality of capacitors, at least one corresponding to each of the multiple stages, each coupled to a corresponding one of the multiple stages; and
    a plurality of switches, each corresponding to one of the plurality of capacitors for selectively coupling the multiple stages to at least one offset voltage in response to an output of the pattern generator.

12. The analog-to-digital converter circuit of claim 11, further comprising a digital-to-analog converter having an input coupled to an output of the pattern generator and an output for providing the offset voltage.

13. The analog-to-digital converter of claim 10, wherein the pattern generator is a pseudo-random number generator for generating the pattern.

14. The analog-to-digital converter of claim 1, wherein the dither generator comprises:
    a pattern generator for generating a pattern of dither values;
    a digital-to-analog converter having an input coupled to an output of the pattern generator and an output for providing an offset voltage; and
    a switching circuit coupled to a summing node of at least one of the multiple stages of the noise-shaping filter charging at least one capacitor to the offset voltage, and transferring charge from the at least one capacitor to the summing node to pre-charge the at least one of the multiple stages of the noise-shaping filter.

15. A method of preventing repeated sequences of constant value at the quantized output of a delta-sigma modulator from causing error in the output of an analog-to-digital converter, comprising:

injecting a dither value into a noise-shaping filter of the delta-sigma modulator; and subtracting an offset from values determined in conformity with the quantized output, whereby error due to injection of the dither value is substantially eliminated.

16. The method of claim 15, wherein the method further comprises filtering the quantized output to provide a conversion result, and wherein the subtracting subtracts the offset from the conversion result.

17. The method of claim 15, wherein the subtracting subtracts the offset directly from the quantized output.

18. The method of claim 15, further comprising:

generating dither values from a dither generator; and multiplying the dither value by a compensation scaling value to obtain the offset.

19. The method of claim 18, wherein the generating generates a new dither value for each conversion cycle of the analog-to-digital converter.

20. The method of claim 18, further comprising determining the compensation scaling value from a relative amount of the dither value applied to multiple stages of the noise-shaping filter.

21. An analog-to-digital converter, comprising:

a noise-shaping filter;

a dither generator for generating dither values, wherein an output of the dither generator is coupled to an input of a stage of the noise-shaping filter;

a quantizer having an input coupled to an output of the noise-shaping filter; and an adjusting element for adjusting values generated in conformity with the output of the quantizer to remove an offset caused by introduction of the dither values to the noise-shaping filter.

22. The analog-to-digital converter of claim 21, further comprising a digital filter for filtering the output of the quantizer to provide an output of the analog-to-digital converter, and wherein the adjusting element removes the offset from the output of the digital filter.

* * * * *